(12) United States Patent
Du Bois et al.

(10) Patent No.: US 6,384,640 B1
(45) Date of Patent: May 7, 2002

(54) PULSE GENERATOR FOR INDICATING A CHANGE IN THE MAGNITUDE OF AN INPUT SIGNAL

(75) Inventors: Paul Louis Du Bois, Flint; William Frank Pakkala, Owosso; Joyce Dale Carsey, Swartz Creek; Daniel Alexander Crawford, Burton; Steven C. Kekel, Grand Blanc, all of MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/697,575

(22) Filed: Oct. 26, 2000

(51) Int. Cl.[7] ................................................ H03K 5/153
(52) U.S. Cl. ...................................... 327/90; 327/72
(58) Field of Search ............................. 327/18, 24, 26, 327/72, 73, 77, 50, 89, 90, 164, 227, 229, 230

(56) References Cited

U.S. PATENT DOCUMENTS 3,763,436 A * 10/1973 Haw ............................ 327/72
4,253,093 A * 2/1981 Johanson et al. ............ 327/50
4,507,795 A * 3/1985 Wagner ....................... 327/72
4,795,971 A * 1/1989 Murao ......................... 327/69
4,939,471 A * 7/1990 Werrbach .................... 327/18

* cited by examiner

Primary Examiner—Toan Tran
(74) Attorney, Agent, or Firm—Vincent A. Cichosz

(57) ABSTRACT

A pulse generator for indicating a change in the magnitude of an input signal includes a comparator, a first network connected to one input of the comparator for receiving the input signal, and a second network connected to the other input of the comparator for receiving the input signal. Both the first and second networks provide output signals to the comparator which transition in response to a magnitude change of the input signal from their respective baseline magnitudes to respective peak magnitudes, and back to their respective baseline magnitudes. The component values of the networks are selected such that one of the first or second network output signals is positive relative to the other network output signal over some period of time during the transition to the peak magnitude and return to the baseline magnitude to cause the comparator to generate a pulse indicating a change in the magnitude of the input signal.

17 Claims, 6 Drawing Sheets

PULSE GENERATOR FOR INDICATING A CHANGE IN THE MAGNITUDE OF AN INPUT SIGNAL

TECHNICAL FIELD

The present invention relates generally to a pulse generator for indicating a change in the magnitude of an input signal, and more particularly to a comparator circuit that generates an output pulse upon either positive or negative transitions of an input signal routed through first and second parallel networks to the positive and negative input terminals of the comparator.

BACKGROUND OF THE INVENTION

The pulse generator of the present invention may be employed to address changes in the automotive industry relating to cruise control systems. Specifically, most conventional cruise control modules are operated by the driver using at least three switches (resume, set speed, and accelerate). Each switch input is typically provided to the cruise module as an individual battery voltage input signal. In other words, if the cruise module detects a battery voltage on an input line corresponding to the resume switch, then the module carries out commands associated with the driver's intent to resume cruise.

There is, however, an increasing demand for analog switch inputs to cruise modules wherein all of the switch signal inputs are provided over a single input line. Each switch, when activated by the driver, results in a different voltage level on the input line to the cruise module. Accordingly, in order to carry out the driver's intent, the cruise module must interpret this voltage level as corresponding to a particular switch.

An A/D converter could be employed to decode the input switch voltage level, but the cost of such converters and associated electronics, as well as the relatively limited opportunities for expanded functionality, make such an approach undesirable. Alternatively, a plurality of staged comparator circuits could be used to decode the input voltage level. Comparator thresholds could be set such that only one comparator will produce an output signal for each of the possible switch input voltage levels. This approach is undesirable because of the relatively large number of components required for its implementation.

A more desirable modification to the conventional cruise module is to employ a switch processing microcontroller (with an on-board A/D converter) to decode the analog switch inputs. While switch processing microcontrollers are relatively expensive, the increased functionality of a microcontroller in addition to the primary microcontroller of the cruise module, and expanded flexibility for future designs outweigh the cost disadvantages.

In addition to increased cost, however, a second microcontroller results in increased radiated emissions due to clocking pulses associated with the microcontroller. Thus, the second microcontroller should include a "sleep" mode function, wherein the microcontroller essentially shuts down until it is needed to decode a switch input, thereby reducing radiated emissions. Accordingly, a circuit is needed for generating a "wake" signal (to activate the second microcontroller) each time the switch input voltage to the cruise module changes.

SUMMARY OF THE INVENTION

The present invention provides a pulse generator for indicating a change in the magnitude of an input signal, such as the analog switch input to a cruise control module, by outputting a pulse which may be used, for example, as a wake signal to activate a switch processing microcontroller as described above. The pulse generator includes a comparator, a first network connected to one input to the comparator, and a second network connected to the other input to the comparator. Each of the first and second networks are capacitively coupled to the analog switch input signal, and include a voltage divider network to scale the input signal. The second network further includes a low pass filter to slow the response of the second network to changes in magnitude of the input signal. Accordingly, the signal outputted by the first network to the first input of the comparator deviates from a baseline magnitude upon the occurrence of an input signal magnitude change more quickly and to a greater extent than does the signal outputted by the second network to the other comparator input.

Thus, when one of the cruise control switches is actuated, the analog switch input signal provided to the first and second networks drops, for example, from a first voltage to a second voltage. The response characteristics of the first and second networks are designated such that the first input to the comparator drops more quickly, and below the signal present at the second input to the comparator. If the first input is the positive input to the comparator, the pulse generator will output a pulse (the wake pulse) with a duration equal to the time during which the first input is less than the second input. Since the analog switch input signal is present at the cruise module input for a period of time which is greater than the duration of the wake pulse, the second microcontroller, once activated, can decode the analog switch input signal. After the input signal is decoded, the second microcontroller re-enters the sleep mode until another switch transition occurs. As such, the second microcontroller remains inactive except when it is needed to decode the analog switch input signal, thereby reducing the radiated emissions of the second microcontroller.

BRIEF DESCRIPTION OF THE DRAWINGS

These and other features will become more apparent and the present invention will be better understood upon consideration of the following description and the accompanying drawings wherein.

DESCRIPTION OF THE PREFERRED EMBODIMENT

The embodiments of the invention described herein are not intended to be exhaustive or to limit the invention to the precise forms disclosed. Rather, the embodiments selected for description have been chosen to enable one skilled in the art to practice the invention.

Figure 1:
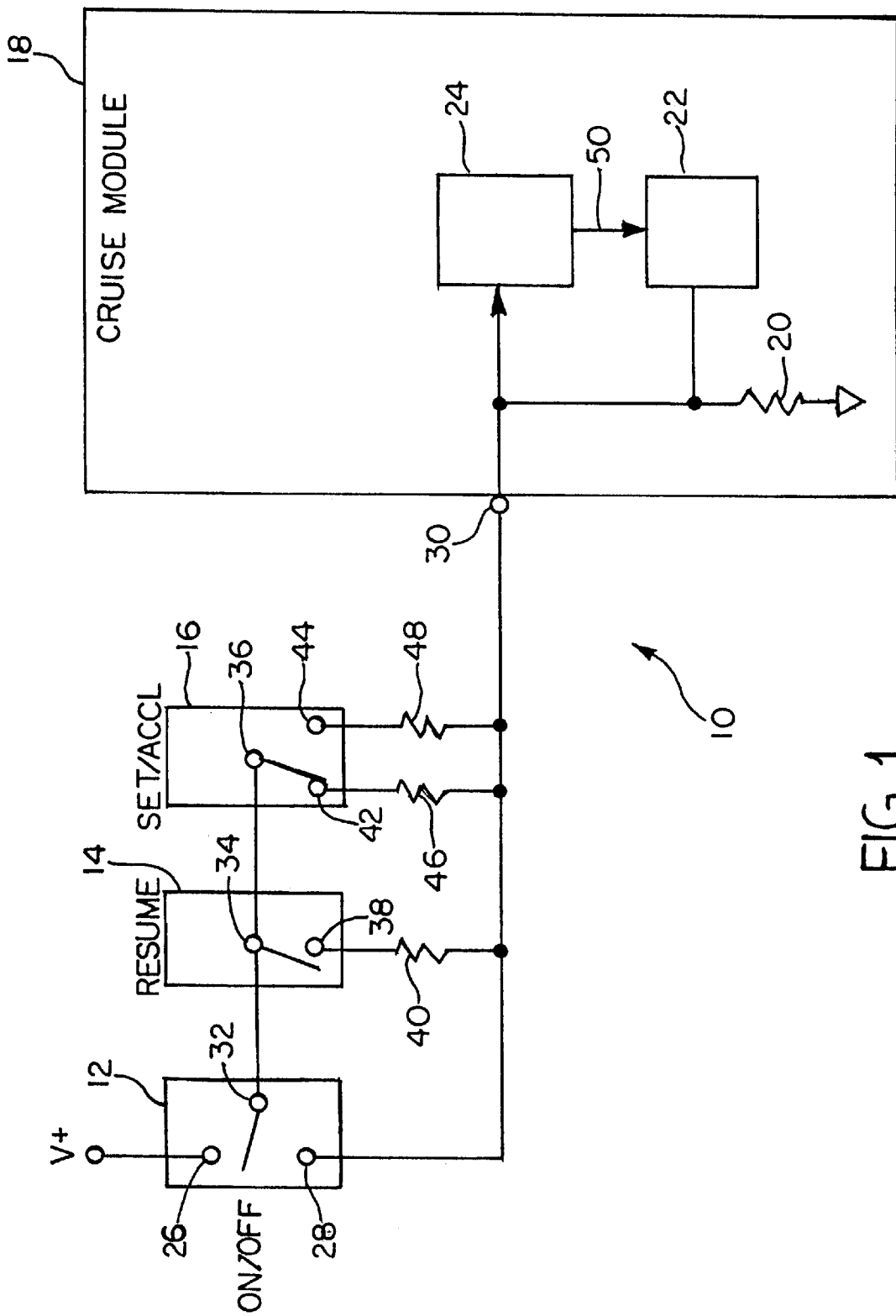
FIG. 1 is a block diagram of an application of the pulse generator according to the present invention.

FIG. 1 shows the basic components of a cruise control system incorporating a pulse generator according to the present invention. The cruise control system 10 generally includes an on-off switch 12, a resume switch 14, a set/accelerate switch 16, and a cruise module 18. Cruise module 18 is typically connected to various indicators and sensors (none shown). Cruise module 18 includes, among other things, a resistor 20, a second microcontroller 22 (for analog switch input signal decoding), and a pulse generator 24.

As shown, one node 26 of on-off switch 12 is connected to a power source, such as the vehicle battery. The other node 28 is connected to input 30 of cruise module 18. Input 30 is connected to pulse generator 24, second microcontroller 22, and resistor 20. The other side of resistor 20 is connected to ground. Common node 32 of switch 12 is connected to node 34 of resume switch 14 and node 36 of set/accelerate switch 16. Node 38 of resume switch 14 is coupled through resistor 40 to input 30 of cruise module 18. Similarly, nodes 42 and 44 of switch 16 are coupled through resistors 46 and 48, respectively, to input 30 of cruise module 18. Pulse generator 24 is connected to second controller 22 by line 50.

When the driver switches on/off switch 12 into the "on" position such that common node 32 contacts node 36, power is applied to node 34 of resume switch 14 and node 36 of set/accelerate switch 16. When the driver moves set/accelerate switch 16, for example, such that node 36 contacts node 42, power is applied to node 42 and the voltage divider network including resistor 46 and resistor 20 results in an analog switch input signal having a particular voltage level at input 30 to cruise module 18. When the signal at input 30 transitions to the voltage associated with the above-described activation of set/accelerate switch 16, pulse generator 24 outputs a wake pulse on line 50 to second controller 22 as described in greater detail below. Second controller 22 becomes active, reads the signal at input 30, and provides a decoded version of that signal to other electronics (not shown) on cruise module 18. The values of resistors 40, 46, 48 are selected such that each of the three possible settings of switches 14, 16 results in a voltage divider network with resistor 20 that provides a different voltage level to input 30 of cruise module 18.

Figure 2:
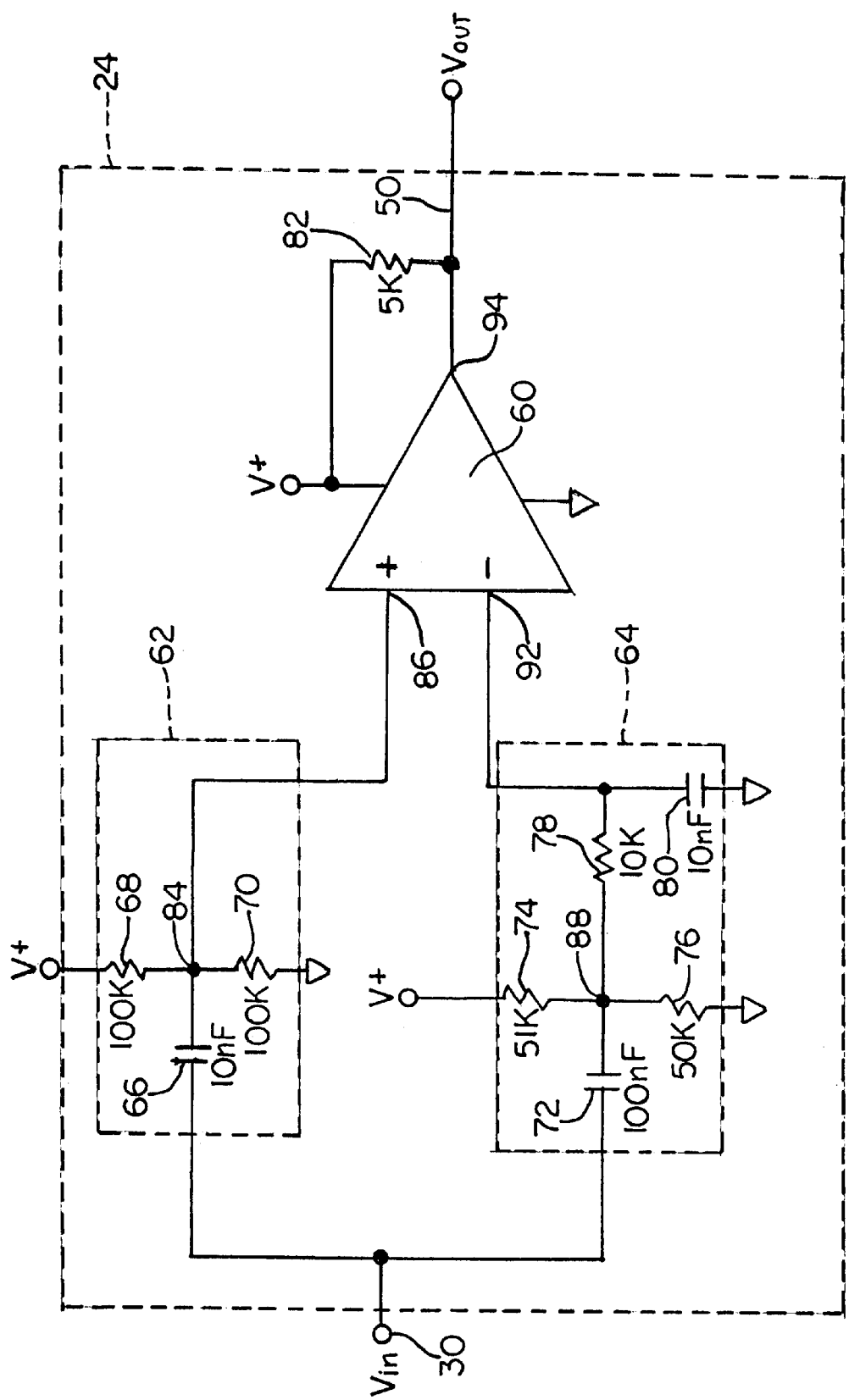
FIG. 2 is a schematic diagram of a pulse generator according to the present invention.

FIG. 2 shows the internal components of pulse generator 24 of FIG. 1. Pulse generator 24 generally includes a comparator 60, a first network 62, and a second network 64. First network 62 includes capacitor 66, resistor 68, and resistor 70. Second network 64 includes capacitor 72, resistor 74, resistor 76, resister 78, and capacitor 80. A pull-up resistor 82 is connected to line 50.

Input 30 is routed to both first network 62 and second network 64. The input signal is capacitively coupled by capacitor 66 to the voltage divider network of resistors 68 and 70 of first network 62. The common node 84 of first network 62 is connected to the positive input 86 of comparator 60. The input signal is also capacitively coupled by capacitor 72 to the voltage divider network of resistors 74 and 76 of second network 64. The common node 88 of resistors 74 and 76 is connected to the low pass filter including resistor 78 and capacitor 80. The output node 90 of the low pass filter is connected to the negative input 92 of comparator 60. The output 94 of comparator 60 is connected by line 50 to second microcontroller 22 as shown in FIG. 1.

Figure 3:
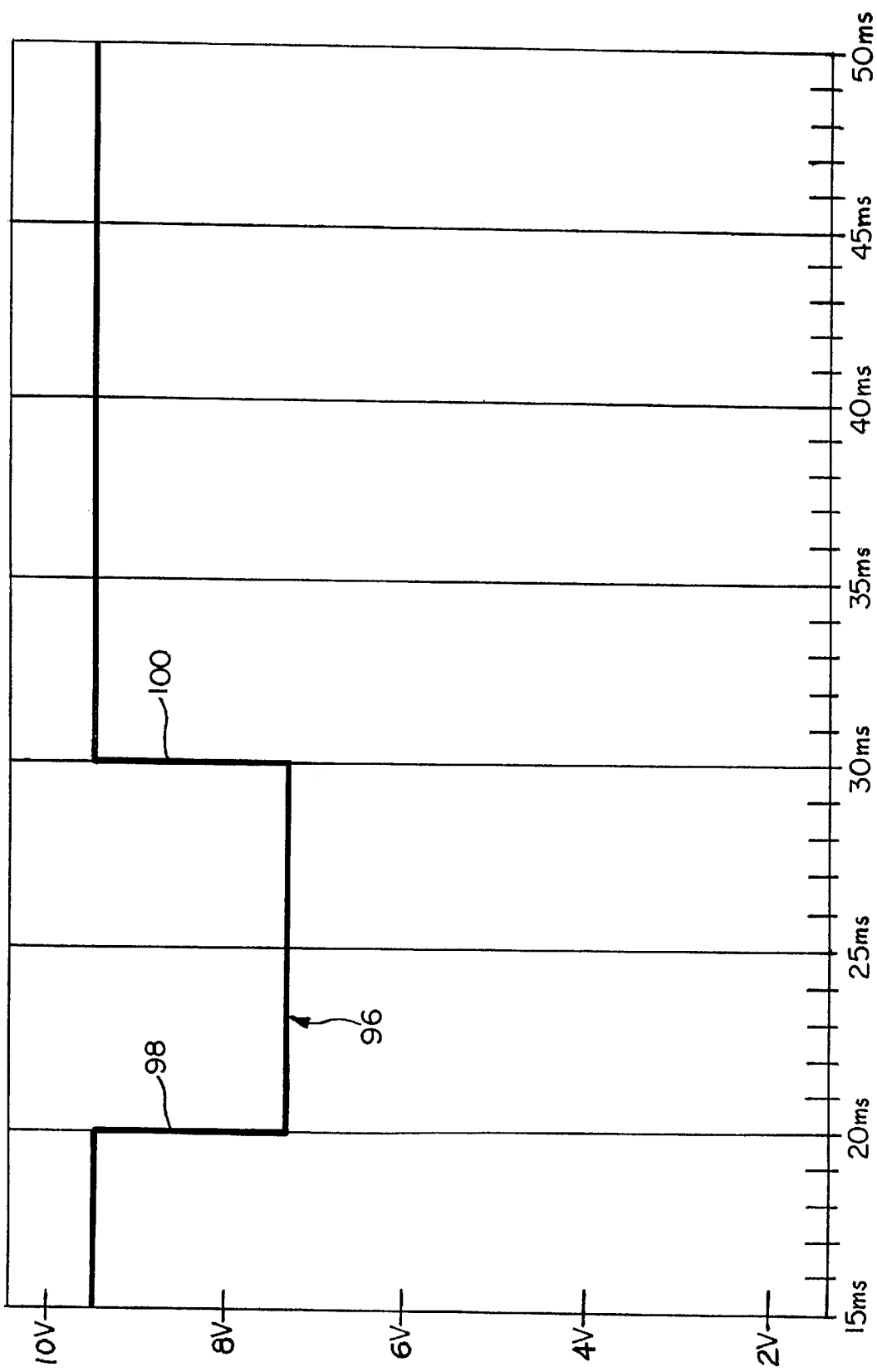
FIGS. 3–5 are waveform diagrams illustrating the relationship between of signals present at various locations of the schematic of FIG. 2.

FIG. 3 shows the analog switch input signal at input 30 over a time period during which one of the three possible switches of FIG. 1 is activated. Signal conditioning circuitry (not shown) results in a baseline magnitude of the input signal of approximately 9.5 volts. For purposes of this description, assume that at a time corresponding to 20 milliseconds on the graph of FIG. 3, the driver actuated resume switch 14 (FIG. 1). Resistor 40 forms a resistor network with resistor 20 which results in an input signal pulse 96. Other electronics (not shown) connected to cruise module 18 limit the duration of pulse 96 to approximately 10 milliseconds. Pulse 96 has a leading edge 98 which transitions from the baseline magnitude of approximately 9.5 volts to a second magnitude of approximately 7.25 volts. Pulse 96 also includes a trailing edge 100 which transitions from the second magnitude to the first magnitude at approximately 30 milliseconds.

Figure 4:
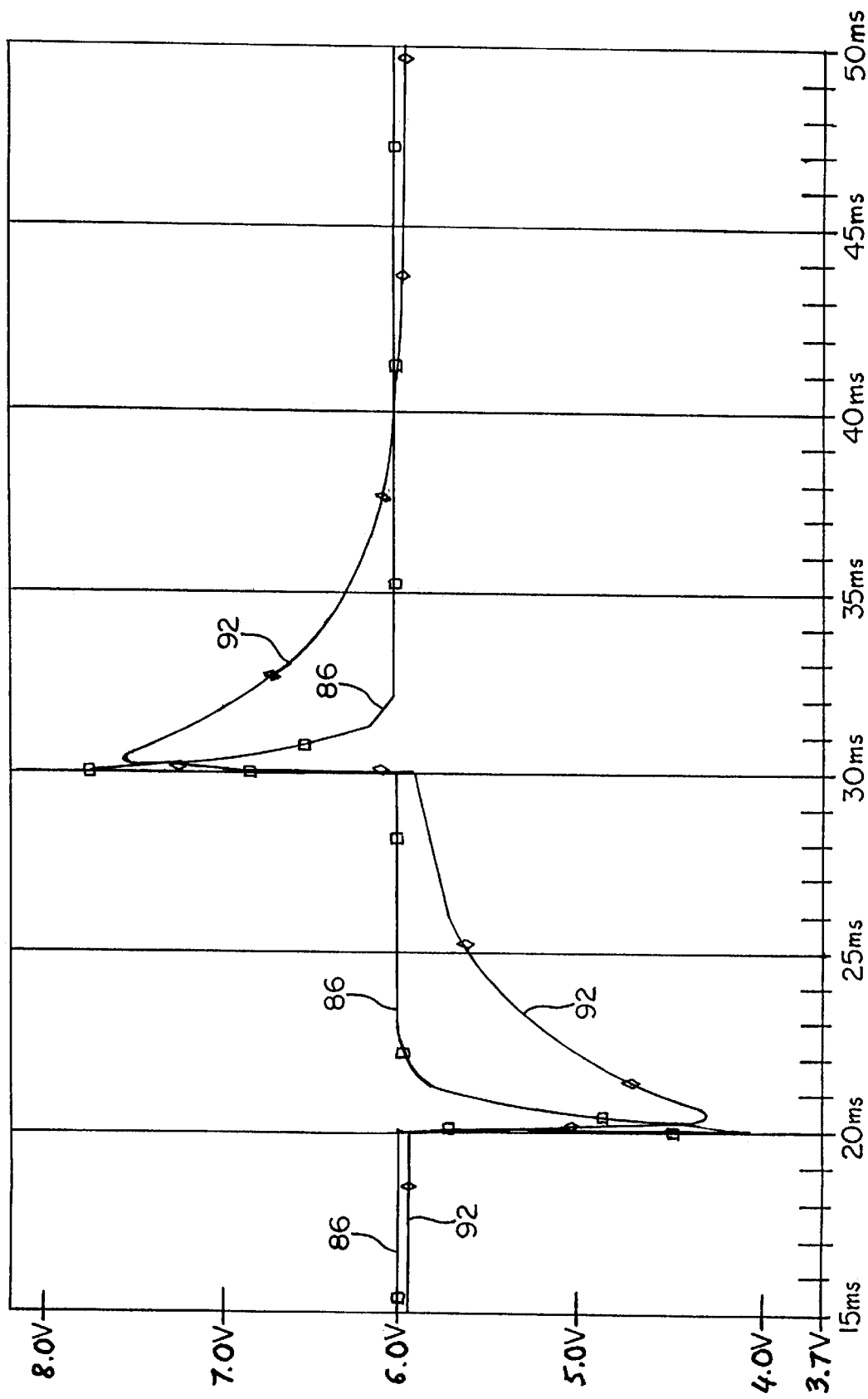

FIG. 4 is a graph showing the signals present at comparator inputs 86 and 92 (i.e., the outputs of first circuit 62 and second circuit 64, respectively) as a result of applying pulse 96 as an input signal to pulse generator 24. Prior to the application of pulse 96, the signal level of negative input 92 is at its baseline magnitude of slightly less than 6 volts, while the baseline magnitude of positive input 86 is slightly higher at approximately 6 volts. Accordingly, comparator 60 outputs a normally high signal on line 50 to second controller 22.

At 20 milliseconds, the negative going leading edge 98 of input signal pulse 96 (FIG. 3) is applied to first and second networks 62, 64. The component values of first network 62 are selected such that the voltage present at common node 84 and, therefore, at positive input 86 of comparator 60, responds quickly to transitions in the input signal. As shown in FIG. 4, the signal at positive input 86 transitions rapidly at 20 milliseconds from its baseline magnitude to a peak deviation magnitude of just over 4 volts. The fast response characteristics of first network 62 also results in a rapid decay of the signal at positive input 86 from its peak deviation magnitude back to its baseline magnitude.

Figure 5:
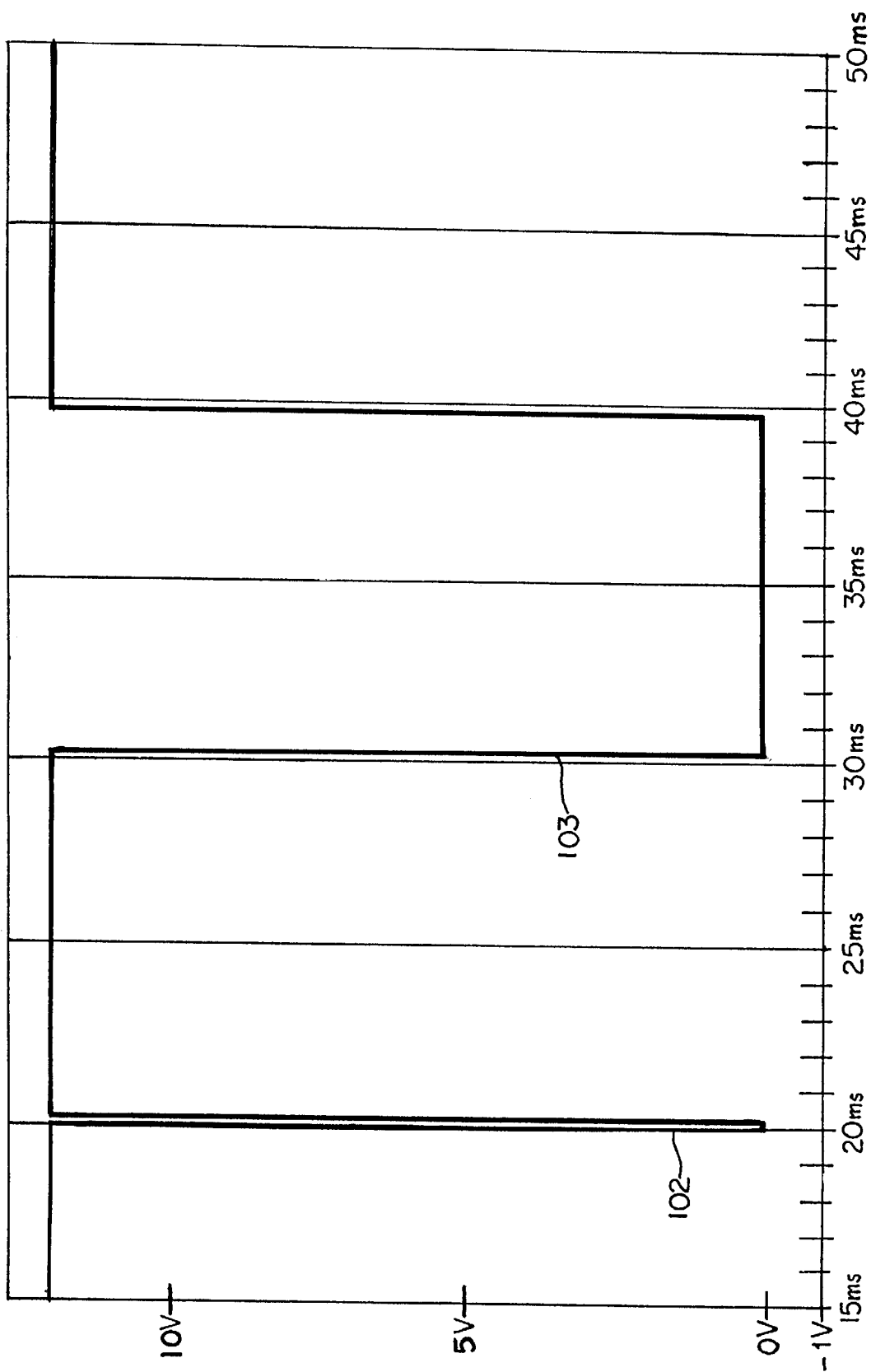

The component values of second network 64 are selected such that its response to input signal magnitude changes is slower than that of first network 62. Accordingly, for a fraction of a millisecond beginning at 20 milliseconds, negative input 92 is greater than positive input 86. Accordingly, comparator 60 generates a wake pulse 102 at output 94 as shown in FIG. 5. In this application, second microcontroller 22 receives wake pulse 102 on line 50 and exits the sleep mode upon detection of the negative going leading edge. Next, second microcontroller 22 initiates a decode sequence according to the flow chart of FIG. 6 to decode the analog switch input at input 30 to cruise module 18.

Figure 6:
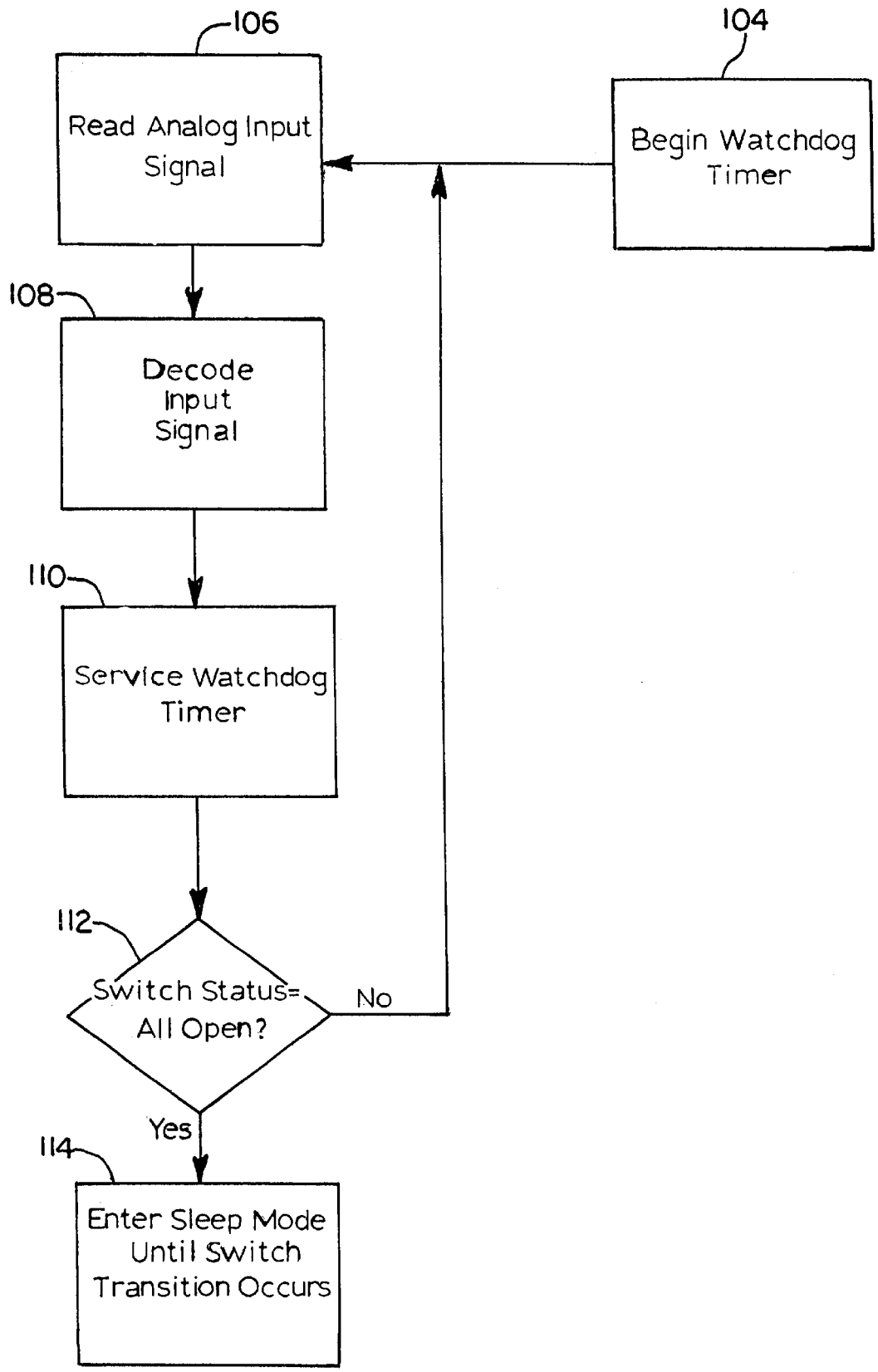
FIG. 6 is a flow chart of an analog switch input signal decoding process.

Referring now to FIG. 6, microcontroller 22 begins a watchdog timer at block 104 before reading the analog switch input signal (in this example, pulse 96 of FIG. 3) present at cruise module input 30 as indicated by block 106. Microcontroller 22 next decodes the input signal by converting it to a digital representation. Next, the watchdog timer is incremented at block 110, and the status of the switches 14, 16 is checked at decision block 112. If switches 14, 16 are not open, second microcontroller 22 continues the loop of reading the input signal, decoding the signal, servicing the watchdog timer, and checking the switch status until either each of switches 14, 16 are open or the watchdog timer times out. The timeout period is set such that a timeout should not occur before the input signal (such as pulse 96) returns to its baseline magnitude. At decision block 112, microcontroller 22 determines whether pulse 96 remains at its second magnitude. So long as pulse 96 remains at approximately 7.25 volts, microcontroller 22 will conclude that switch 14 is still closed. After the positive going trailing edge 100 of pulse 96 occurs, microcontroller 22 will conclude at decision block 112 that switches 14, 16 are open and re-enter sleep mode at block 114.

As shown in FIGS. 4 and 5, the positive going trailing edge 100 of pulse 96 results in a positive spike at inputs 86, 92 of comparator 60 at approximately 30 milliseconds. As was the case with the negative going spike, the signal at positive input 86 deviates to a maximum peak magnitude faster than the signal at negative input 92. Additionally, the difference between the peak magnitude and the baseline magnitude of the signal at positive input 86 is greater than the difference between the peak magnitude and the baseline magnitude of the signal at negative input 92. However, since signal 86 decays faster than signal 92, for approximately 10 milliseconds beginning just after 30 milliseconds, negative input 92 is greater than positive input 86. Accordingly, comparator 60 outputs a wake pulse 103 during this time period as shown in FIG. 5.

Microcontroller 22 re-enters sleep mode after a predetermined period of time passes without receiving a wake pulse 103.

As should be apparent from the foregoing, the component values of pulse generator 24 of FIG. 2 should be selected such that the minimum expected change in magnitude of the input signal (either positive or negative) will result in a signal at negative input 92 of comparator 60 which is greater for a period of time than the input present at positive input 86.

Although the present invention has been shown and described in detail, the same is to be taken by way of example only and not by way of limitation. Numerous changes can be made to the embodiments described above without departing from the scope of the invention.

What is claimed is:

1. A pulse generator for indicating a change in the magnitude of an input signal, including:
   a comparator having a first input, a second input, and an output;
   a first network having an input for receiving an input signal and an output connected to the comparator first input, the first network output providing an output signal having a baseline magnitude; and
   a second network having an input for receiving the input signal and an output connected to the comparator second input, the second network output providing an output signal having a baseline magnitude;
   wherein in response to an input signal magnitude change, both the first and second network output signals transition from their respective baseline magnitudes to respective peak magnitudes and back to their respective baseline magnitudes such that at some time before both network output signals return to their respective baseline magnitudes, the difference between the magnitude of the first network output signal and the first network baseline magnitude is less than the difference between the magnitude of the second network output signal and the second network baseline magnitude, and wherein the difference between the first network baseline and peak magnitudes is greater than the difference between the second network baseline and peak magnitudes, thereby causing the comparator to output a pulse indicating the input signal magnitude change.

2. The pulse generator of claim 1 wherein the first network output signal transitions from its baseline magnitude to its peak magnitude faster than the second network output signal transitions from its baseline magnitude to its peak magnitude.

3. The pulse generator of claim 1 wherein the first network output signal transitions from its peak magnitude to its baseline magnitude faster than the second network output signal transitions from its peak magnitude to its baseline magnitude.

4. The pulse generator of claim 2 wherein the first network output signal transitions from its peak magnitude to its baseline magnitude faster than the second network output signal transitions from its peak magnitude to its baseline magnitude.

5. The pulse generator of claim 1 wherein the first network baseline magnitude is different from the second network baseline magnitude.

6. The pulse generator of claim 1 wherein the second network includes a low pass filter to slow the response of the second network to the input signal magnitude change.

7. A pulse generator for indicating a change in the magnitude of an input signal, including:
   a comparator having a first input, a second input, and an output;
   a first network having an input for receiving an input signal and an output connected to the comparator first input, the first network output providing an output signal having a baseline magnitude, the first network further including a capacitor connected between the first network input and the first network output; and
   a second network having an input for receiving the input signal and an output connected to the comparator second input, the second network output providing an output signal having a baseline magnitude, the second network further including a capacitor connected between the second network input and the second network output;
   wherein in response to an input signal magnitude change, both the first and second network output signals transition from their respective baseline magnitudes to respective peak magnitudes and back to their respective baseline magnitudes such that at some time before both network output signals return to their respective baseline magnitudes, the difference between the magnitude of the first network output signal and the first network baseline magnitude is less than the difference between the magnitude of the second network output signal and the second network baseline magnitude, thereby causing the comparator to output a pulse indicating the input signal magnitude chance.

8. A pulse generator for indicating a change in the magnitude of an input signal, including:
   a comparator having a first input, a second input, and an output;
   a first network having an input for receiving an input signal and an output connected to the comparator first input, the first network output providing an output signal having a baseline magnitude, the first network further including:
      a voltage divider having an output node connected to the comparator first input, and a capacitor having one side receiving the input signal and another side connected to the output node; and
   a second network having an input for receiving tie input signal and an output connected to the comparator second input, the second network output providing an output signal having a baseline magnitude, the second network further including:
      a voltage divider having an output node connected to a low pass filter, the filter being connected to the comparator second input, and a capacitor having one side receiving the input signal and another side connected to the second network voltage divider output node;
   wherein in response to an input signal magnitude change, both the first and second network output signals transition from their respective baseline magnitudes to respective peak magnitudes and back to their respective baseline magnitudes such that at some time before both network output signals return to their respective baseline magnitudes, the difference between the magnitude of the first network output signal and the first network baseline magnitude is less than the difference between the magnitude of the second network output signal and the second network baseline magnitude, thereby causing the comparator to output a pulse indicating the input signal magnitude change.

9. A pulse generator for indicating a magnitude change of an input signal voltage, including:

a comparator having a first input, a second input, and an output;

a first network having an input for receiving an input signal and an output connected to the comparator first input, the first network output providing an output signal having a baseline magnitude; and a second network having an input for receiving the input signal and an output connected to the comparator second input, the second network output providing an output signal having a baseline magnitude;

wherein responsive to an input signal magnitude change, both the first and second network output signals transition from their respective baseline magnitudes to respective peak magnitudes and back to their respective baseline magnitudes such that at some time before both network output signals return to their respective baseline magnitudes, the difference between the magnitude of the first network output signal and the first network baseline magnitude is greater than the difference between the magnitude of the second network output signal and the second network baseline magnitude, and wherein the difference between the first network baseline and peak magnitudes is greater than the difference between the second network baseline and peak magnitudes, thereby causing the comparator to output a pulse indicating the input signal magnitude change.

10. The pulse generator of claim 9 wherein the first network output signal transitions from its baseline magnitude to its peak magnitude faster than the second network output signal transitions from its baseline magnitude to its peak magnitude.

11. The pulse generator of claim 9 wherein the first network output signal transitions from its peak magnitude to its baseline magnitude faster than the second network output signal transitions from its peak magnitude to its baseline magnitude.

12. The pulse generator of claim 11 wherein the first network output signal transitions from its peak magnitude to its baseline magnitude faster than the second network output signal transitions from its peak magnitude to its baseline magnitude.

13. The pulse generator of claim 9 wherein the first network baseline magnitude is different from the second network baseline magnitude.

14. The pulse generator of claim 9 wherein the second network includes a low pass filter to slow the response of the second network to the input signal magnitude change.

15. The pulse generator of claim 9 wherein the input signal magnitude change is a magnitude increase, in response to an input signal magnitude decrease, both the first and second network output signals transition from their respective baseline magnitudes to respective second peak magnitudes and back to their respective baseline magnitudes such that at some time before both network output signals return to their respective baseline magnitudes, the difference between the magnitude of the first network output signal and the first network baseline magnitude is less than the difference between the magnitude of the second network output signal and the second network baseline magnitude, thereby causing the comparator to output a pulse indicating the input signal magnitude decrease.

16. A pulse generator for indicating a magnitude change of an input signal voltage, including:

a comparator having a first input, a second input, and an output;

a first network having an input for receiving an input signal and an output connected to the comparator first input, the first network output providing an output signal having a baseline magnitude, and the first network further including a capacitor connected between the first network input and the first network output; and a second network having an input for receiving the input signal and an output connected to the comparator second input, the second network output providing an output signal having a baseline magnitude, and the second network further including a capacitor connected between the second network input and the second network output;

wherein responsive to an input signal magnitude change, both the first and second network output signals transition from their respective baseline magnitudes to respective peak magnitudes and back to their respective baseline magnitudes such that at some time before both network output signals return to their respective baseline magnitudes, the difference between the magnitude of the first network output signal and the first network baseline magnitude is greater than the difference between the magnitude of the second network output signal and the second network baseline magnitude, thereby causing the comparator to output a pulse indicating the input signal magnitude change.

17. A pulse generator for indicating a magnitude change of an input signal voltage, including:

a comparator having a first input, a second input, and an output;

a first network having an input for receiving an input signal and an output connected to the comparator first input, the first network output providing an output signal having a baseline magnitude, the first network further including:

a voltage divider having an output node connected to the comparator first input, and a capacitor having one side receiving the input signal and another side connected to the output node; and a second network having an input for receiving the input signal and an output connected to the comparator second input, the second network output providing an output signal having a baseline magnitude, the second network further including:

a voltage divider having an output node connected to a low pass filter, the filter being connected to the comparator second input, and a capacitor having one side receiving the input signal and another side connected to the second network voltage divider output node;

wherein responsive to an input signal magnitude change, both the fist and second network output signals transition from their respective baseline magnitudes to respective peak magnitudes and back to their respective baseline magnitudes such that at some time before both network output signals return to their respective baseline magnitudes, the difference between the magnitude of the first network output signal and the fist network baseline magnitude is greater than the difference between the magnitude of the second network output signal and the second network baseline magnitude, thereby causing the comparator to output a pulse indicating the input signal magnitude change.

* * * * *